United States Patent
Hua et al.

(10) Patent No.: US 12,356,728 B2
(45) Date of Patent: *Jul. 8, 2025

(54) PROTECTION CIRCUIT WITH A FET DEVICE COUPLED FROM A PROTECTED BUS TO GROUND

(71) Applicant: Semtech Corporation, Camarillo, CA (US)

(72) Inventors: Lei Hua, Camarillo, CA (US); William Allen Russell, Thousand Oaks, CA (US); Changjun Huang, Oak Park, CA (US); Bo Liang, Shanghai (CN); Pengcheng Han, Shenzhen (CN)

(73) Assignee: Semtech Corporation, Camarillo, CA (US)

( * ) Notice: Subject to any disclaimer, the term of this patent is extended or adjusted under 35 U.S.C. 154(b) by 208 days.

This patent is subject to a terminal disclaimer.

(21) Appl. No.: 17/364,407

(22) Filed: Jun. 30, 2021

(65) Prior Publication Data

US 2021/0327870 A1 Oct. 21, 2021

Related U.S. Application Data

(63) Continuation of application No. 16/292,540, filed on Mar. 5, 2019, now Pat. No. 11,114,432.

(60) Provisional application No. 62/643,923, filed on Mar. 16, 2018.

(51) Int. Cl.
*H10D 89/60* (2025.01)
*H02H 9/04* (2006.01)
*H10D 10/00* (2025.01)

(52) U.S. Cl.
CPC .......... *H10D 89/814* (2025.01); *H02H 9/041* (2013.01); *H02H 9/046* (2013.01); *H10D 89/713* (2025.01); *H10D 89/819* (2025.01); *H10D 10/00* (2025.01)

(58) Field of Classification Search
None
See application file for complete search history.

(56) References Cited

U.S. PATENT DOCUMENTS

| | | | |
|---|---|---|---|
| 5,352,932 A | 10/1994 | Tihanyi | |
| 6,411,481 B1 * | 6/2002 | Seubert | H02H 9/041 361/111 |
| 9,305,916 B1 | 4/2016 | Cai et al. | |
| 2004/0057172 A1 | 3/2004 | Sun | |

(Continued)

FOREIGN PATENT DOCUMENTS

| | | | | |
|---|---|---|---|---|
| CN | 104426531 A | * | 3/2015 | ............. H02H 9/041 |
| EP | 2757688 A1 | | 7/2014 | |

(Continued)

*Primary Examiner* — Sarah K Salerno
(74) *Attorney, Agent, or Firm* — Brian M. Kaufman; Robert D. Atkins; PATENT LAW GROUP: Atkins and Associates, P.C.

(57) ABSTRACT

A semiconductor device includes a voltage input circuit node and a ground voltage node. A first transistor is coupled between the voltage input circuit node and the ground voltage node. A triggering circuit is coupled between the voltage input circuit node and the ground voltage node in parallel with the first transistor. The triggering circuit includes a trigger diode. An output of the triggering circuit is coupled to a control terminal of the first transistor. A load is powered by coupling the load between the voltage input circuit node and the ground voltage node.

15 Claims, 12 Drawing Sheets

(56) References Cited

U.S. PATENT DOCUMENTS

| | | |
|---|---|---|
| 2005/0264968 A1 | 12/2005 | Chen |
| 2011/0304940 A1 | 12/2011 | Cao et al. |
| 2013/0128400 A1 | 5/2013 | Yeh |
| 2014/0355157 A1 | 12/2014 | Huang et al. |
| 2015/0162746 A1 | 6/2015 | Ikeda |
| 2016/0134103 A1* | 5/2016 | Namizaki ............... H02H 9/041 361/56 |
| 2016/0372457 A1 | 12/2016 | Reinprecht |
| 2017/0366001 A1 | 12/2017 | Cao |
| 2017/0373490 A1* | 12/2017 | Zhu ........................ H02H 9/046 |
| 2018/0159320 A1* | 6/2018 | Brasola ................... H02M 1/32 |

FOREIGN PATENT DOCUMENTS

| | | |
|---|---|---|
| EP | 2822035 A1 | 1/2015 |
| EP | 3154198 A1 | 4/2017 |
| JP | 2015115339 A | 6/2015 |
| JP | 2017055299 A | 3/2017 |

* cited by examiner

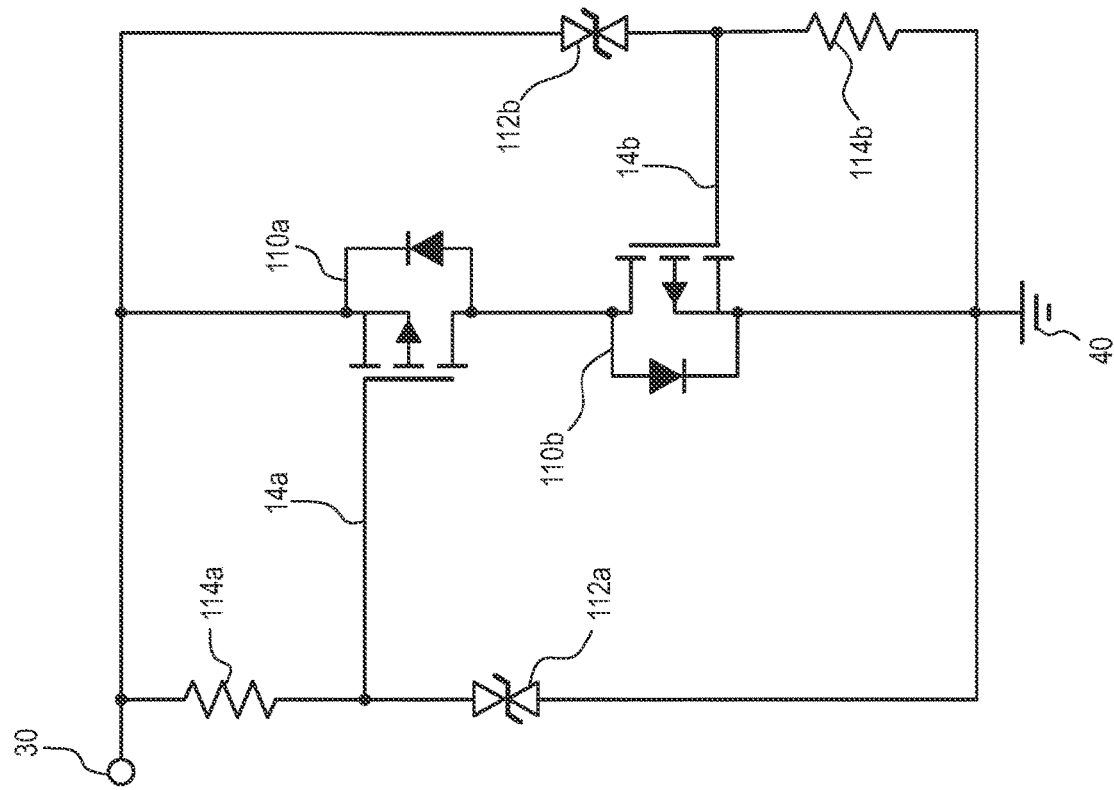
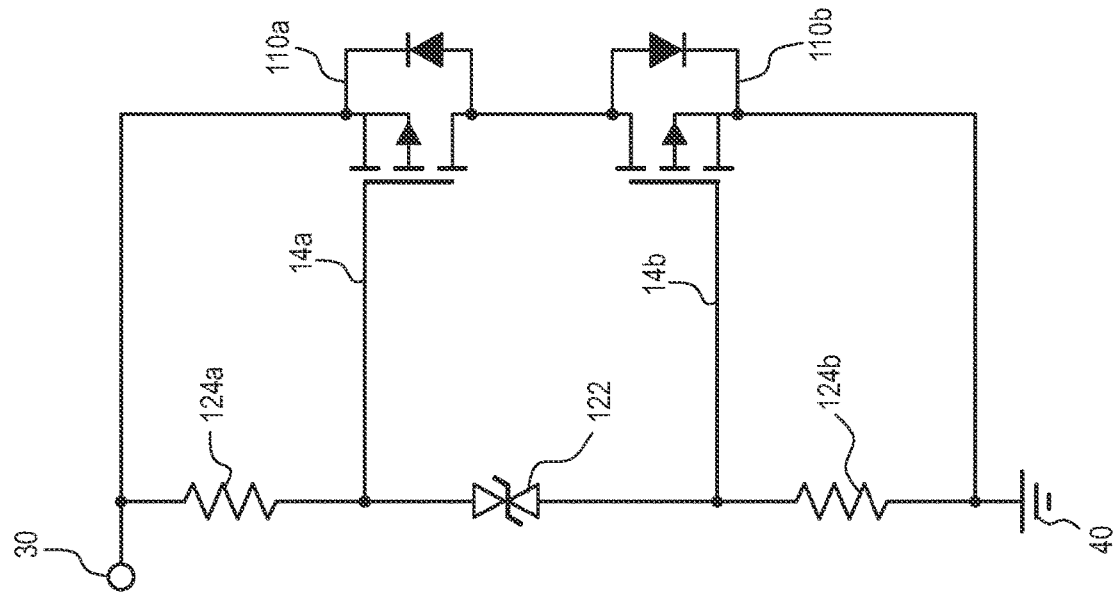
FIG. 7a
FIG. 7b

US 12,356,728 B2

PROTECTION CIRCUIT WITH A FET DEVICE COUPLED FROM A PROTECTED BUS TO GROUND

CLAIM TO DOMESTIC PRIORITY

The present application is a continuation of U.S. patent application Ser. No. 16/292,540, now U.S. Pat. No. 11,114,432, filed Mar. 5, 2019, which claims the benefit of U.S. Provisional Application No. 62/643,923, filed Mar. 16, 2018, which applications are incorporated herein by reference.

FIELD OF THE INVENTION

The present invention relates in general to electrical overstress (EOS) and electrostatic discharge (ESD) protection circuits, and, more particularly, to a protection circuit that routes electrical current surges to ground through a transistor.

BACKGROUND OF THE INVENTION

Semiconductor devices are commonly found in modern electronic products. Semiconductor devices vary in the number and density of electrical components. Discrete semiconductor devices generally contain one type of electrical component, e.g., a light emitting diode (LED), small signal transistor, resistor, capacitor, inductor, or power metal-oxide-semiconductor field-effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as signal processing, high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Transient voltage suppression (TVS) diodes are commonly used to protect semiconductor devices from electrostatic discharge (ESD) and electrical overstress (EOS) events. A TVS diode can be provided with the cathode connected to a voltage input of the semiconductor device and the anode connected to a ground node to protect from voltage surges on the voltage input. A TVS diode is approximately an open circuit at normal voltage levels, but the resistance of electrical current through the TVS diode is significantly reduced when the input voltage potential exceeds a breakdown voltage ($V_{BR}$) of the TVS diode. Excess electrical current from ESD or EOS events flows through the TVS diode to the ground node, which helps keep the input voltage potential within safe levels for the attached load. The load can be an integrated circuit (IC), circuit board, another circuit element, any combination of circuit elements, or any other device being powered by the input voltage.

One problem with TVS diodes for ESD and EOS suppression is that TVS diodes absorb a large portion of the transient energy shunted to ground. Thus, a high-energy TVS must be physically large. The problem is compounded for high voltage systems, such as industrial sensors, automotive load dumps, and motor controllers. Because the maximum amount of energy a TVS diode can absorb is proportional to its size, applications with both high voltage input and high current transients may require an impractically large TVS diode. Therefore, a need exists for an improved protection device usable for high voltage and high transient current surge suppression applications.

BRIEF DESCRIPTION OF THE DRAWINGS

FIGS. 7a-7c illustrate bi-directional protection circuits utilizing EOS FETs;

DETAILED DESCRIPTION OF THE DRAWINGS

The present invention is described in one or more embodiments in the following description with reference to the figures, in which like numerals represent the same or similar elements. While the invention is described in terms of the best mode for achieving the invention's objectives, those skilled in the art will appreciate that the description is intended to cover alternatives, modifications, and equivalents as may be included within the spirit and scope of the invention as defined by the appended claims and the claims' equivalents as supported by the following disclosure and drawings.

Figure 1:
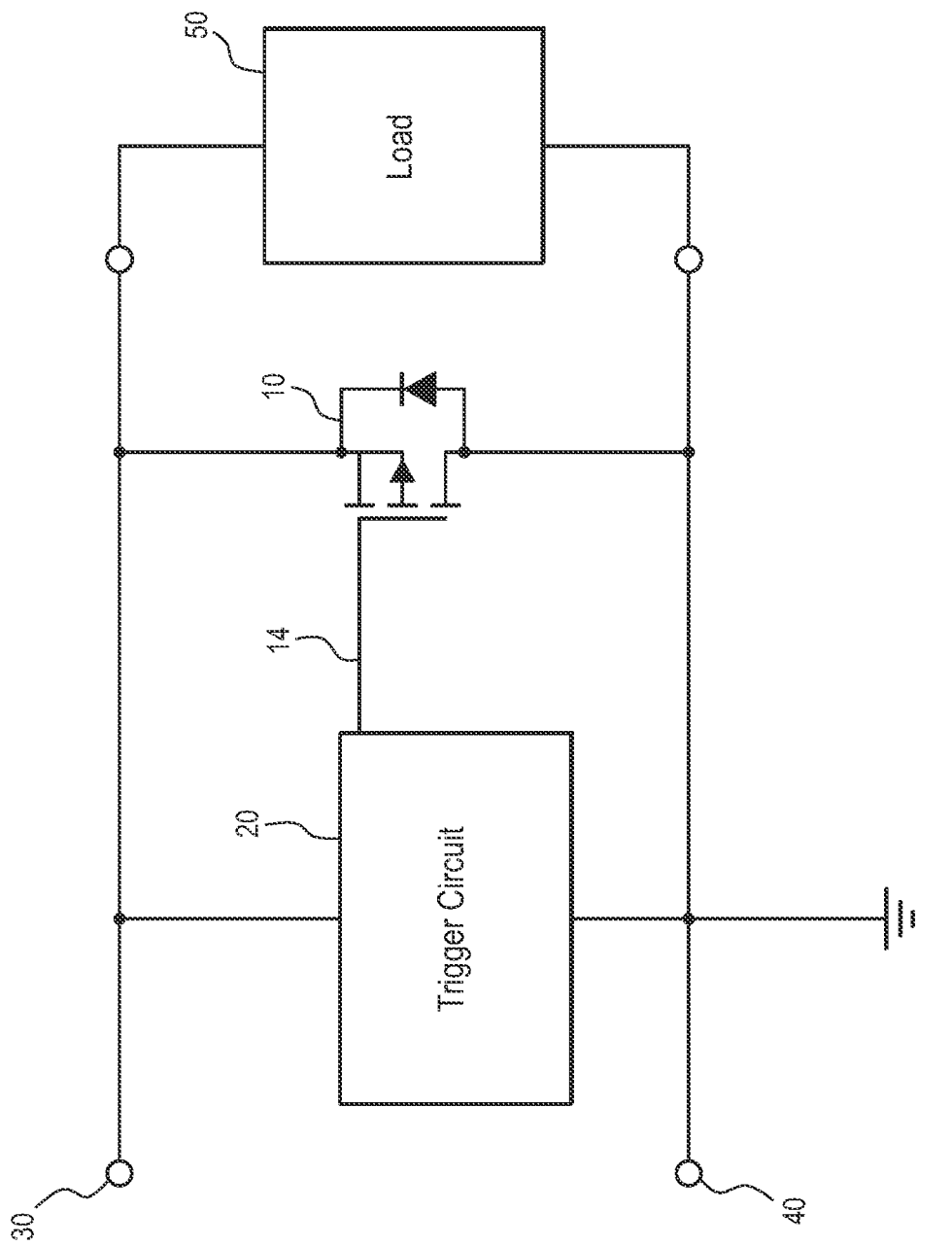
FIG. 1 illustrates a field effect transistor (FET) coupled between a voltage line and ground for EOS suppression.

FIG. 1 illustrates a FET based electrical over-stress (EOS) suppression device. While EOS is specifically discussed, the FET based suppression device can be used to protect a load from other types of unwanted electrical transients. In FIG. 1, EOS FET 10 includes a source terminal coupled to input voltage ($V_{IN}$) node 30 and a drain terminal coupled to ground node 40. A gate terminal 14 of EOS FET 10 is coupled to a triggering circuit 20. Triggering circuit 20 is coupled between $V_{IN}$ node 30 and ground node 40 in parallel with EOS FET 10. Triggering circuit 20 controls EOS FET 10 similar to an on-off switch, switching electrical current from $V_{IN}$ node 30 to ground node 40 through the EOS FET on or off using an output coupled to gate terminal 14.

A load 50 to be protected is coupled between $V_{IN}$ node 30 and ground node 40 in parallel with EOS FET 10. During normal operation, EOS FET 10 is off and no significant electrical current flows through the EOS FET from $V_{IN}$ node 30 to ground node 40. Current flows from $V_{IN}$ node 30 to ground node 40 through load 50 to power the load. When an electrical transient on $V_{IN}$ node 30 is detected by triggering circuit 20, the triggering circuit turns on EOS FET 10 to route excess energy on $V_{IN}$ node 30 to ground node 40.

Turning on EOS FET 10 routes electrical current through the EOS FET rather than through load 50, thus keeping $V_{IN}$ node 30 at safe voltage potentials for the load. When the transient on $V_{IN}$ node 30 subsides, triggering circuit 20 turns EOS FET 10 back off, and the load continues being powered by the voltage potential of the $V_{IN}$ node as normal.

One advantage of a FET based protection circuit is that the EOS FET topology does not have a latch-up mechanism. The prior art commonly uses circuits such as a TRIAC or SCR, that latch up and continue conducting current until the input voltage is completely removed. However, triggering circuit 20 is able to turn EOS FET 10 off when $V_{IN}$ node 30 returns to a normal voltage potential, even if the input voltage does not return to zero. Another advantage is the deep snap back offered by EOS FET 10. EOS FET 10 has a low on-state voltage, thus dissipating more power for a given die size. While EOS FET 10 is illustrated as a p-channel FET, n-channel FETs can be used as well.

Figure 2B:
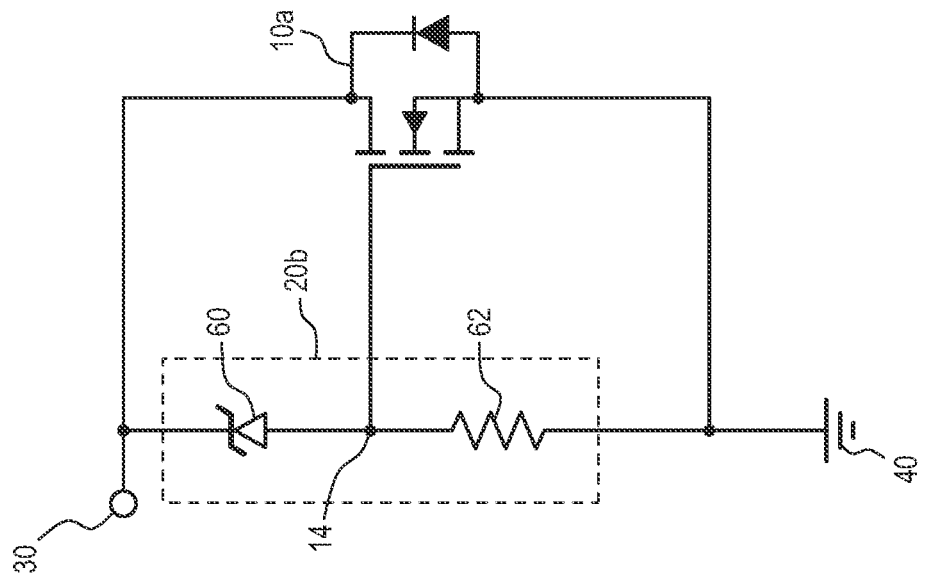
FIGS. 2a and 2b illustrate using TVS diodes as triggering circuits for the EOS FET.
Figure 2A:
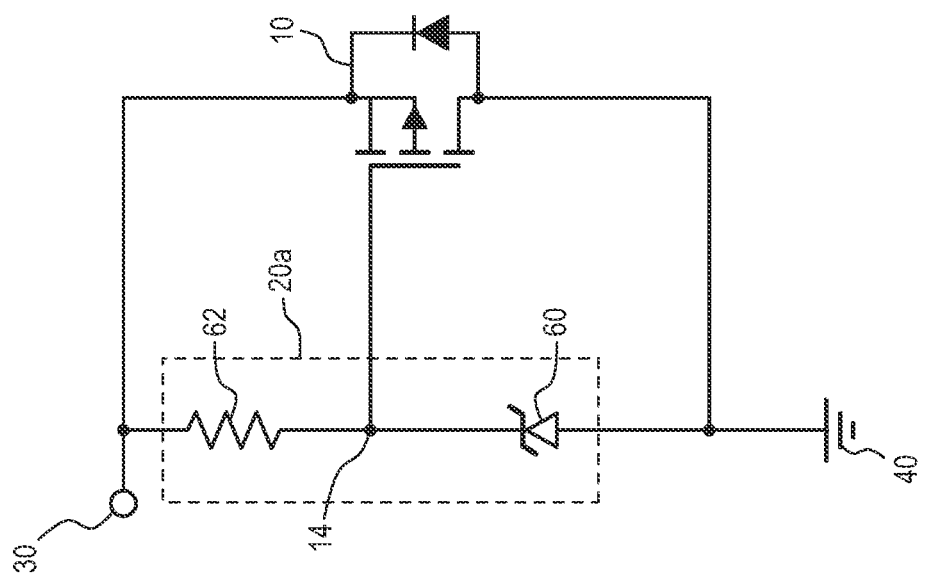

FIGS. 2a and 2b illustrate triggering circuit 20 formed using a trigger diode 60 and a resistor 62 coupled in series between $V_{IN}$ node 30 and ground node 40. Trigger diode 60 can be any form of trigger diode, such as a TVS diode, Zener diode, or another device that contains single or multiple p-n junctions. Trigger diode 60 can be any circuit element that is approximately open circuit below a given voltage potential of $V_{IN}$ node 30 and conducts electricity when $V_{IN}$ node 30 exceeds the given voltage. Trigger diode 60 is selected to have a breakdown voltage ($V_{BR}$) equal to or greater than the expected voltage potential input to load 50.

FIG. 2a uses triggering circuit 20a to trigger a p-channel EOS FET 10. Triggering circuit 20a includes resistor 62 coupled between $V_{IN}$ node 30 and gate 14 of EOS FET 10. Trigger diode 60 includes a cathode coupled to gate 14 and an anode coupled to ground node 40. Trigger diode 60 and resistor 62 are coupled in series between $V_{IN}$ node 30 and ground node 40, and gate 14 of EOS FET 10 is coupled to the circuit node between the trigger diode and resistor.

During normal operation, resistor 62 couples gate 14 to $V_{IN}$ node 30, keeping the gate of EOS FET 10 at approximately the voltage potential of $V_{IN}$ node 30. The source terminal of EOS FET 10 is coupled to $V_{IN}$ node 30, so the gate-to-source voltage is approximately zero and EOS FET remains off. When the voltage potential of $V_{IN}$ node 30 exceeds the $V_{BR}$ of trigger diode 60, electrical current flows through the trigger diode, and therefore resistor 62. The resulting voltage drop across resistor 62 lowers the voltage potential at gate terminal 14 of EOS FET 10, which causes the source-to-gate voltage to exceed the turn-on threshold of the EOS FET. EOS FET 10 is turned on, which shunts EOS current from $V_{IN}$ node 30 to ground node 40. While some electrical current continues to flow through resistor 62 and trigger diode 60, a large majority of the transient electrical current being shunted to ground node 40 is through EOS FET 10. Trigger diode 60 can be made relatively small because electrical current through the trigger diode is orders of magnitude smaller than the overall surge current.

FIG. 2b illustrates a similar circuit utilizing triggering circuit 20b to trigger a n-channel EOS FET 10a. Triggering circuit 20b has the cathode of trigger diode 60 coupled to $V_{IN}$ node 30 and the anode of the trigger diode coupled to gate 14. Resistor 62 is coupled between gate 14 and ground node 40. The positions of resistor 62 and trigger diode 60 are switched between triggering circuits 20a and 20b.

Triggering circuit 20b operates similarly to triggering circuit 20a. During normal operation, resistor 62 couples gate 14 to ground node 40, and keeps the gate terminal at approximately the voltage potential of ground node 40.

When the input voltage potential at $V_{IN}$ node 30 exceeds the $V_{BR}$ of trigger diode 60, electrical current flows through trigger diode 60 and resistor 62 in series from the $V_{IN}$ node to ground node 40. The resultant voltage drop across resistor 62 raises the voltage potential at gate 14 of EOS FET 10a, thus turning on the EOS FET. Transient energy spikes on $V_{IN}$ node 30 are diverted to ground node 40 through EOS FET 10a, as in FIG. 2a. In both FIGS. 2a and 2b, trigger diode 60 substantially stops conducting electrical current when the transient event subsides, and the circuit returns to the normal operating state with EOS FET 10 or 10a turned off.

Figure 3B:
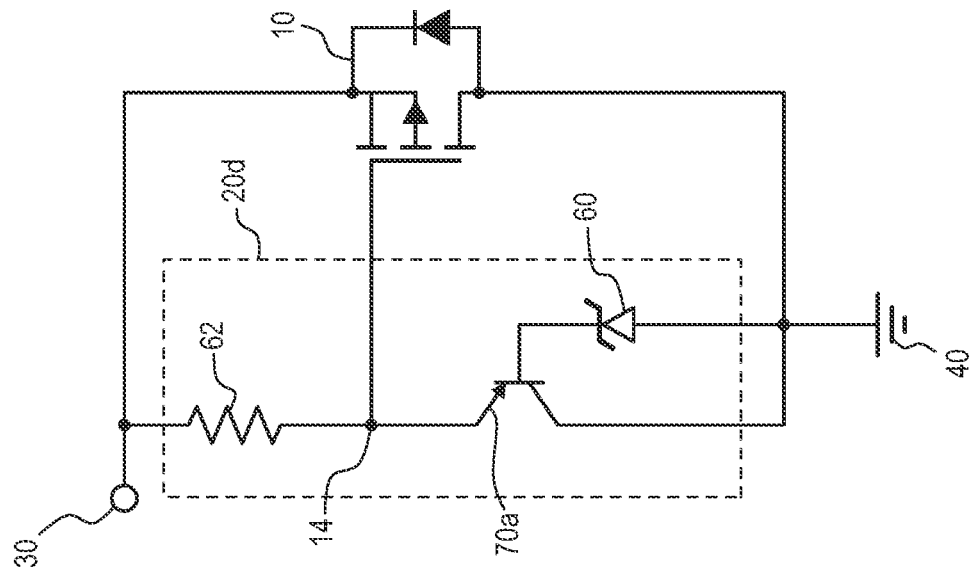
FIGS. 3a and 3b illustrate bipolar junction transistors (BJTs) used in the EOS FET triggering circuit.
Figure 3A:
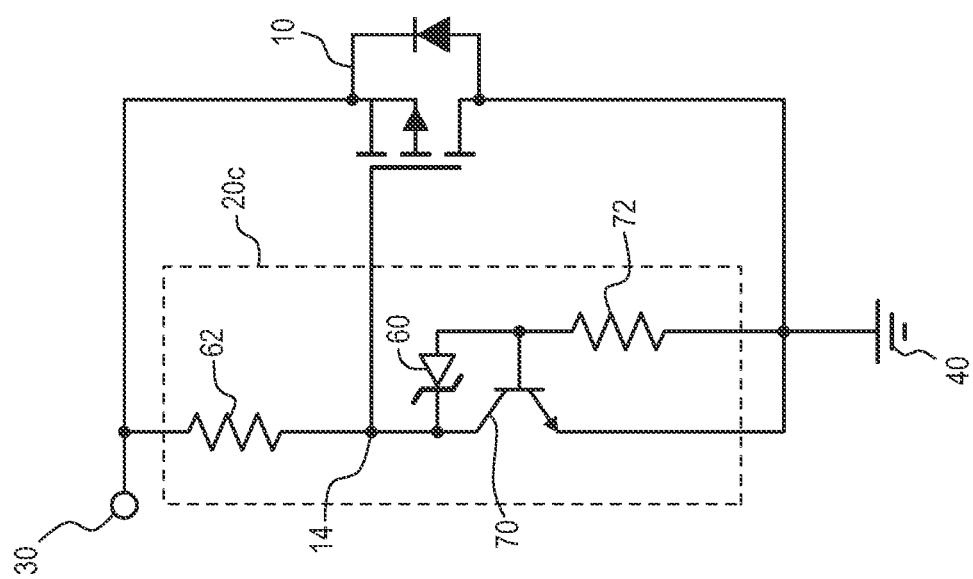

FIGS. 3a and 3b illustrate embodiments using bipolar junction transistors (BJTs) in the triggering circuit. Trigging circuit 20c in FIG. 3a is similar to triggering circuit 20a in FIG. 2a with BJT 70 and resistor 72 added. BJT 70 is an NPN BJT with a collector terminal coupled to the cathode of trigger diode 60, a base terminal coupled to the anode terminal of the trigger diode, and an emitter terminal coupled to ground node 40. Resistor 72 is coupled from the base of BJT 70 to ground node 40.

In one mode of operation, triggering circuit 20c with BJT 70 operates similarly to triggering circuit 20a in FIG. 2a. Resistor 62, resistor 72, and trigger diode 60 are coupled in series between $V_{IN}$ node 30 and ground node 40. Resistor 62, trigger diode 60, and the base-to-emitter junction of BJT 70 are also coupled in series between $V_{IN}$ node 30 and ground node 40. When the voltage potential of $V_{IN}$ node 30 rises and exceeds the $V_{BR}$ of trigger diode 60 plus the base-to-emitter voltage ($V_{BE}$) of BJT 70, enough biasing current flows into the base of BJT 70 to turn on the BJT. The collector of BJT 70, which is connected to $V_{IN}$ node 30 through resistor 62, clamps at the voltage of the BJT $V_{BE}$ plus the $V_{BR}$ of trigger diode 60. Once current through resistor 62 causes a sufficient voltage drop at gate 14, EOS FET 10 turns on to divert surge current primarily through the EOS FET rather than BJT 70. Resistor 72 is a bleeding resistor that helps bypass some current through trigger diode 60 to ground node 40 instead of into the base of BJT 70. Resistor 72 helps reduce the likelihood of BJT 70 turning on undesirably under high temperature conditions.

In a second mode of operation, BJT 70 has the added benefit of reducing the response time of the triggering circuit during high slew rate transients. When the voltage potential of $V_{IN}$ node 30 rises at a sufficiently high rate, electrical current through a parasitic capacitance of BJT 70 is able to raise the voltage potential at the base of the BJT. The current through the parasitic capacitance of BJT 70 is able to turn on the BJT prior to the input voltage reaching the breakdown voltage of trigger diode 60 plus the $V_{BE}$ of BJT 70 during a transient event with a sufficiently fast rise time. Because BJT 70 turns on EOS FET 10 at a lower voltage than the $V_{BR}$ of trigger diode 60 plus $V_{BE}$ of BJT 70 by being slew rate triggered, the clamping voltage across the circuit, and thus power dissipation in the EOS FET, is reduced. A triggering circuit with BJT 70 can handle even higher peak pulse currents at the same FET size due to the reduced clamping voltage. Another advantage is that BJT 70 helps sink some of the transient current to ground in addition to allowing transients to be shunted to ground sooner.

Figure 6B:
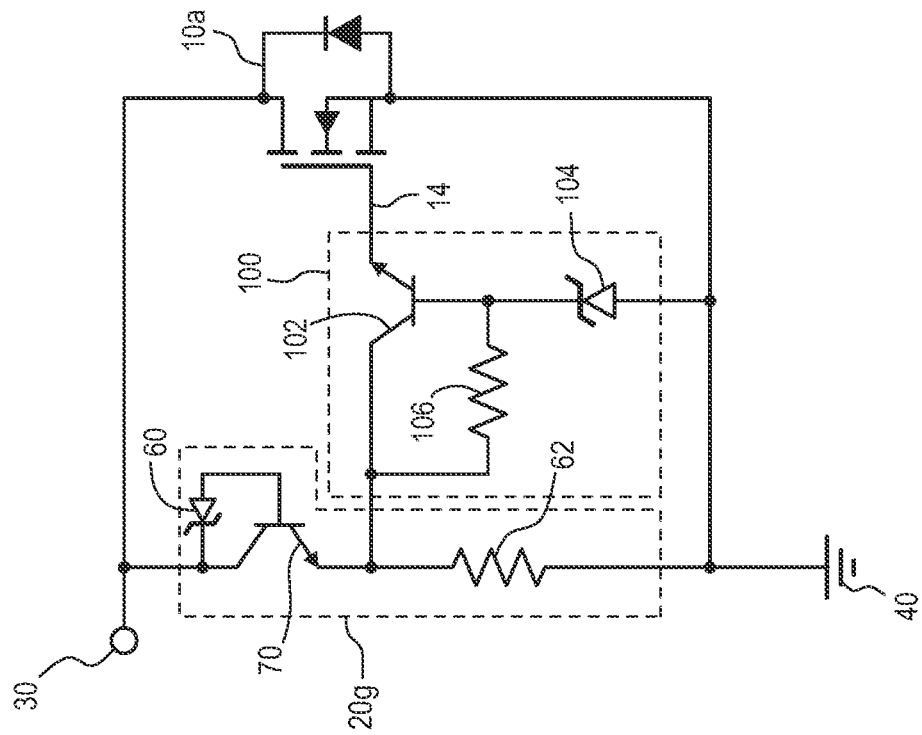
FIGS. 6a-6c illustrate a voltage-limiting circuit coupled to the EOS FET gate terminal.

FIG. 3b illustrates a similar circuit with a PNP BJT 70a. BJT 70a includes an emitter terminal coupled to $V_{IN}$ node 30 through resistor 62, a base terminal coupled to the cathode of trigger diode 60, and a collector terminal coupled to ground node 40. The anode of trigger diode 60 is coupled to ground node 40. Gate 14 of EOS FET 10 is coupled to a circuit node between BJT 70a and resistor 62. When the input voltage exceeds the sum of the base-to-emitter turn-on voltage of BJT 70*a* and the $V_{BR}$ of trigger diode 60, current flows through resistor 62 and the voltage drop across the resistor turns on EOS FET 10. As above in FIG. 3*a*, electrical current through the parasitic capacitor of BJT 70*a* during high slew-rate transient events is capable of turning on the BJT prior to $V_{IN}$ node 30 reaching the $V_{BR}$ of trigger diode 60. While a p-channel EOS FET 10 is used in FIGS. 3*a* and 3*b*, similar circuits could be made using either an NPN or PNP BJT and n-channel EOS FET 10*a*. One example is illustrated in FIG. 6*b* below.

Figure 4B:
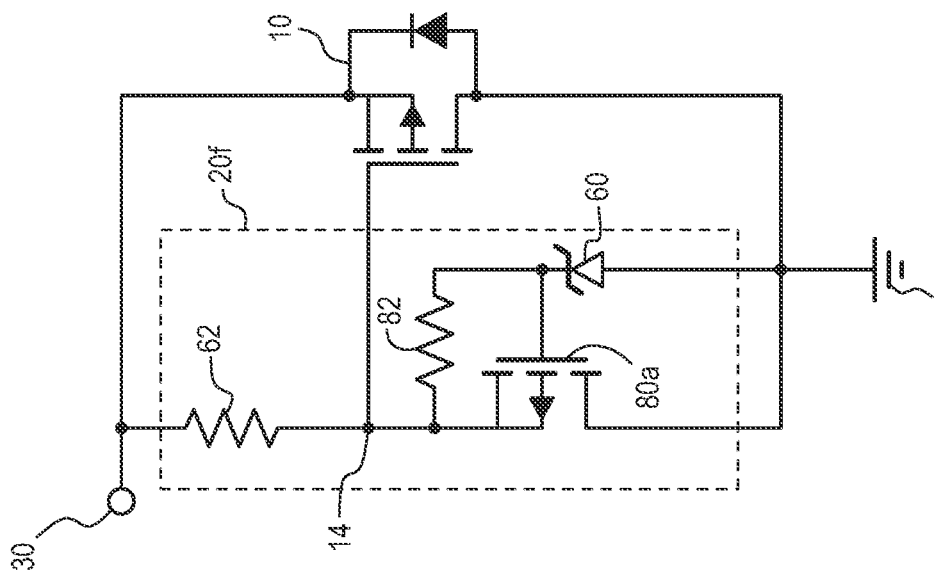
FIGS. 4a and 4b illustrate FETs used in the EOS FET triggering circuit.
Figure 4A:
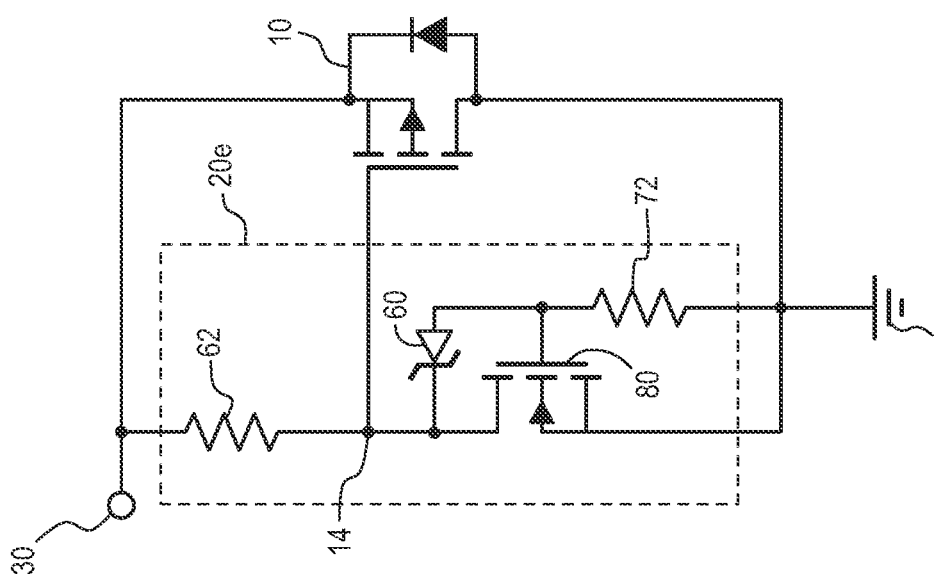

FIGS. 4*a* and 4*b* illustrate similar circuits to those in FIGS. 3*a* and 3*b*, but with BJTs 70 and 70*a* replaced by FET devices 80 and 80*a*, respectively. Triggering circuits 20*e* and 20*f* in FIGS. 4*a* and 4*b* operate similarly, and provide similar benefits, to triggering circuits 20*c* and 20*d* in FIGS. 3*a* and 3*b*. Triggering circuit 20*f* adds a resistor 82 to create a control voltage at the gate terminal of FET 80*a*, which was not necessary in triggering circuit 20*d* because BJT 70*a* is controlled by an electrical current.

Figure 5:
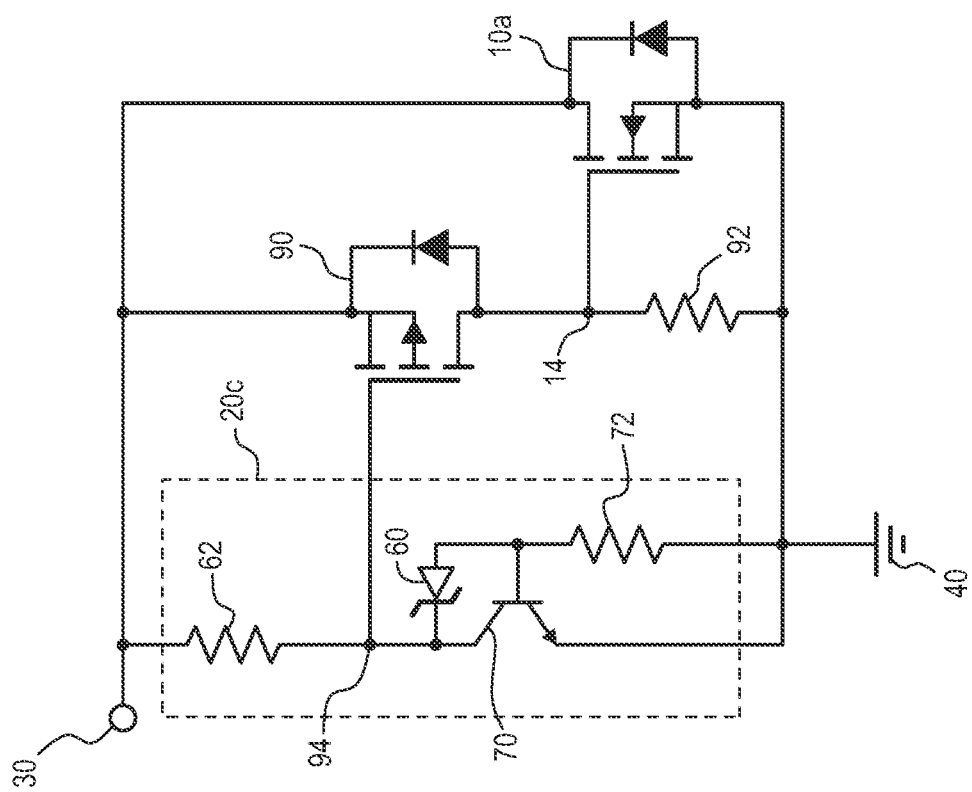
FIG. 5 illustrates a p-channel FET configured to trigger the EOS FET, which is an n-channel FET.

FIG. 5 illustrates an embodiment with the main path for conducting transient current being n-channel EOS FET 10*a*. A p-channel FET 90 is used to drive EOS FET 10*a*. Gate 94 of FET 90 is coupled to a circuit node between BJT 70 and resistor 62. Triggering circuit 20*c* in FIG. 5 is the same as in FIG. 3*a*, but any of the above or below described triggering circuits can be used with FET 90 between the triggering circuit and the EOS FET as a driver. When the input voltage on $V_{IN}$ node 30 exceeds the threshold for triggering circuit 20*c* turning on FET 90, current flows through resistor 92. The current through resistor 92 raises the voltage at gate 14 of EOS FET 10*a*, thus turning on the EOS FET and diverting transient current to ground through the main EOS FET.

An n-channel FET, as used for EOS FET 10*a* in FIG. 5, is desirable because an n-channel FET is normally smaller than a p-channel FET for a given current sinking capability. However, the n-channel EOS FET 10*a* requires a positive gate to source voltage to turn on. Having n-channel EOS FET 10*a* triggered by p-channel FET 90 allows the EOS FET to be triggered by a negative gate-to-source control signal from triggering circuit 20*c* using FET 90 as a driver. In other embodiments, an n-channel FET 90 is used to drive a p-channel EOS FET 10.

Figure 6A:
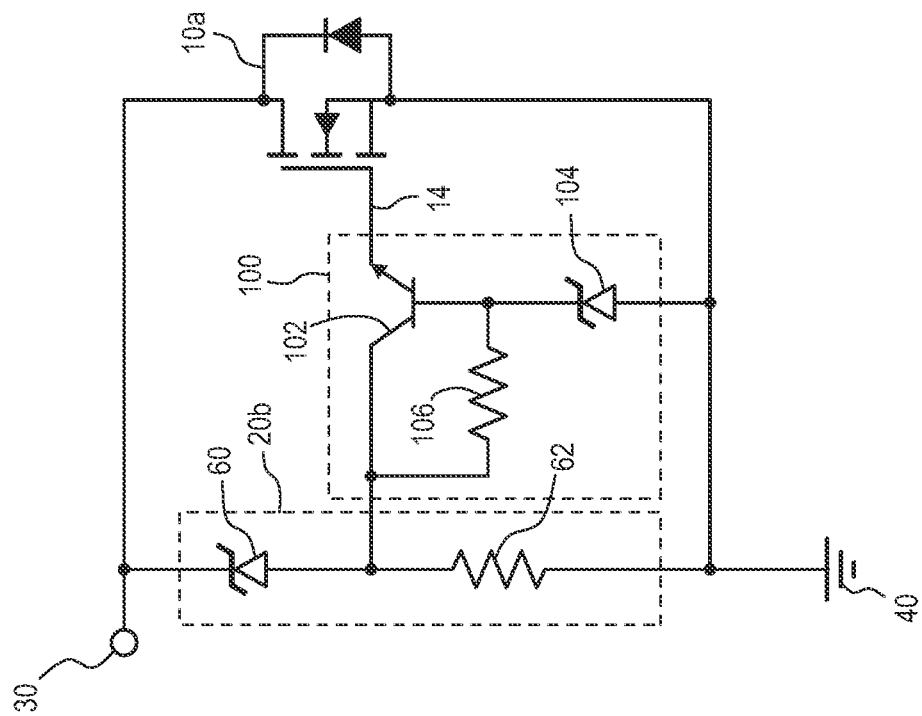
Figure 6C:
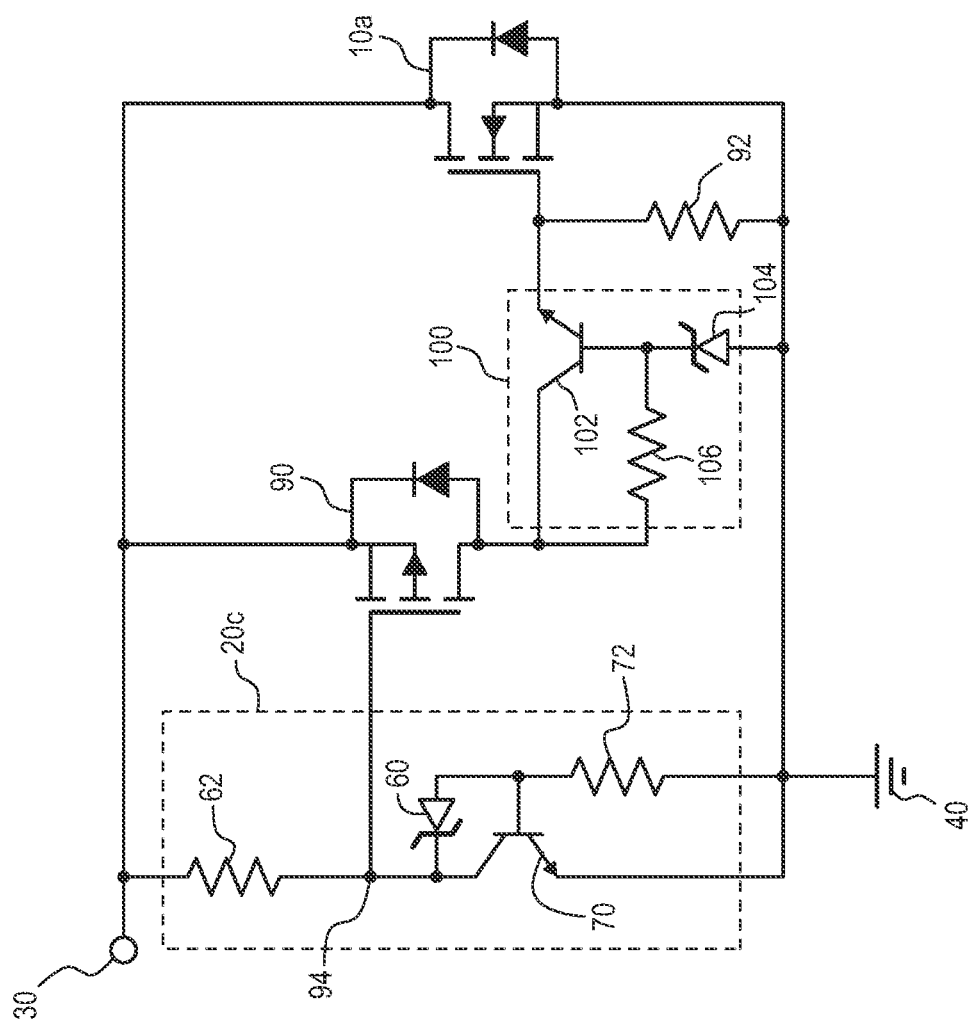

FIGS. 6*a*-6*c* illustrate a voltage-limiting circuit 100 coupled between triggering circuit 20 and EOS FET 10*a*. FIG. 6*a* illustrates the embodiment of FIG. 2*b* with the addition of a voltage-limiting circuit 100 coupled between triggering circuit 20*b* and EOS FET 10*a*. Voltage-limiting circuit 100 includes BJT 102, diode 104, and resistor 106. Diode 104 is a Zener diode or another type of diode with a predictable $V_{BR}$. As with FIG. 2*b*, EOS FET 10*a* is turned on when $V_{IN}$ node 30 exceeds the $V_{BR}$ of trigger diode 60. Resistor 106 routes electrical current from $V_{IN}$ node 30 to the base terminal of BJT 102 to forward bias the base-emitter junction and allow current to flow from the $V_{IN}$ node to the gate of EOS FET 10*a*. In FIG. 2*a*, the voltage potential at gate terminal 14 increases indefinitely with increasing voltage of $V_{IN}$ node 30. In FIG. 6*a*, voltage-limiting circuit 100 limits the voltage at gate terminal 14. When the voltage potential at gate 14 exceeds the $V_{BR}$ of diode 104, electrical current from $V_{IN}$ node 30 through trigger diode 60 flows through resistor 106 and diode 104 to ground node 40 rather than only through resistor 62 to further increase the voltage at gate 14.

FIG. 6*b* illustrates voltage-limiting circuit 100 applied to a variation of the triggering mechanism in FIGS. 3*a* and 3*b* having an n-channel EOS FET 10*a* and an NPN BJT 70. In triggering circuit 20*g* of FIG. 6*b*, BJT 70 is coupled between $V_{IN}$ node 30 and gate 14 to account for the n-channel FET, as opposed to triggering circuit 20*c* where BJT 70 is between the gate and ground node 40.

FIG. 6*c* illustrates voltage-limiting circuit 100 applied to the embodiment of FIG. 5 with triggering circuit 20*c* and driver FET 90. BJT 102, diode 104, and resistor 106 in FIGS. 6*b* and 6*c* limit the voltage potential at the gate terminal of EOS FET 10*a* in a similar manner as in FIG. 6*a*. A similar voltage-limiting circuit can be used with any of the above or below described triggering circuits, with any of the triggering circuit 20 embodiments, and with or without driver FET 90.

Figure 7C:
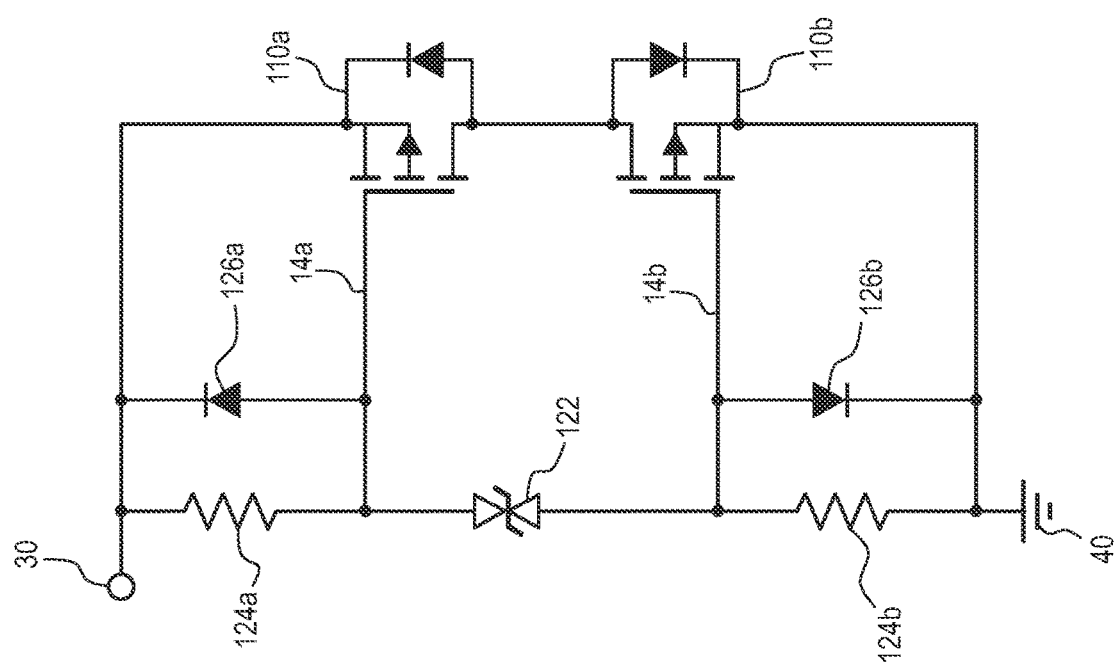

A bidirectional transient suppression circuit, i.e., able to conduct transient surges with either positive or negative polarity, can be made by combining any two of the above or below described unidirectional transient voltage suppression circuits in a back-to-back configuration. FIGS. 7*a*-7*c* illustrate additional bi-directional embodiments formed using bi-directional trigger diodes along with two p-channel EOS FETs.

In FIG. 7*a*, EOS FETs 110*a* and 110*b* are coupled in series between $V_{IN}$ node 30 and ground node 40. Both EOS FETs 110*a* and 110*b* are p-channel FETs. Trigger diodes 112*a* and 112*b* are bi-directional trigger diodes. Trigger diodes 112*a* and 112*b* conduct electrical current if the voltage potential at $V_{IN}$ node 30 exceeds ground node 40 by at least the breakdown voltage of the trigger diodes, or if the $V_{IN}$ node is below ground by the breakdown voltage or more. When trigger diodes 112*a* and 112*b* conduct with a positive input voltage at $V_{IN}$ node 30, electrical current through resistor 114*a* creates a voltage across the resistor that turns on EOS FET 110*a*. The transient current flows through EOS FET 110*a* and the body diode of EOS FET 110*b* to ground node 40. Even though electrical current through resistor 114*b* raises the voltage potential at gate 14*b*, keeping EOS FET 110*b* turned off, the transient current is able to flow through EOS FET 110*b* via the body diode.

When trigger diodes 112*a* and 112*b* conduct a transient having a negative voltage potential on $V_{IN}$ node 30, current through resistor 114*b* turns on EOS FET 110*b* allowing the transient current to flow through EOS FET 110*b* and the body diode of EOS FET 110*a*. With either positive or negative transients on $V_{IN}$ node 30, transient current flows primarily through EOS FETs 110*a* and 110*b*.

FIG. 7*b* illustrates another bi-directional embodiment with trigger diode 122 and resistors 124*a* and 124*b* coupled in series between $V_{IN}$ node 30 and ground node 40. Trigger diode 122 is coupled to $V_{IN}$ node 30 through resistor 124*a* and ground node 40 through resistor 124*b*. EOS FETs 110*a* and 110*b* are both p-channel devices and coupled in series with each other between $V_{IN}$ node 30 and ground node 40 in parallel with diode 122, resistor 124*a*, and resistor 124*b*. Gate 14*a* of EOS FET 110*a* is coupled between resistor 124*a* and trigger diode 122. Gate 14*b* of EOS FET 110*b* is coupled between resistor 124*b* and trigger diode 122. Current flows through trigger diode 122 when the voltage potential of $V_{IN}$ node 30 exceeds the $V_{BR}$ of the trigger diode in either the positive or the negative direction relative to ground node 40. Electrical current through resistor 124*a* from $V_{IN}$ node 30 during positive transients turns on EOS FET 110*a*, and transient current is shunted to ground node 40 through EOS FET 110*a* and the body diode of EOS FET 110*b*. Electrical current through resistor 124*b* from ground node 40 during negative transients on $V_{IN}$ node 30 turns on EOS FET 110*b*, and the negative transient current is shunted to ground through EOS FET 110*b* and the body diode of EOS FET 110*a*.

FIG. 7*c* illustrates an embodiment with optional diodes 126*a* and 126*b* added to the embodiment of FIG. 7*b*. Diodes 126*a* and 126*b* help by limiting the voltage drop across resistors 124*a* and 124*b*, respectively, when the voltage across the respective resistor 124 is not being relied on to turn on a respective EOS FET 110. Diodes 126*a* and 126*b* limit the voltage potential of gates 14*a* and 14*b* in the direction that turns off the respective EOS FET 110.

Figure 8B:
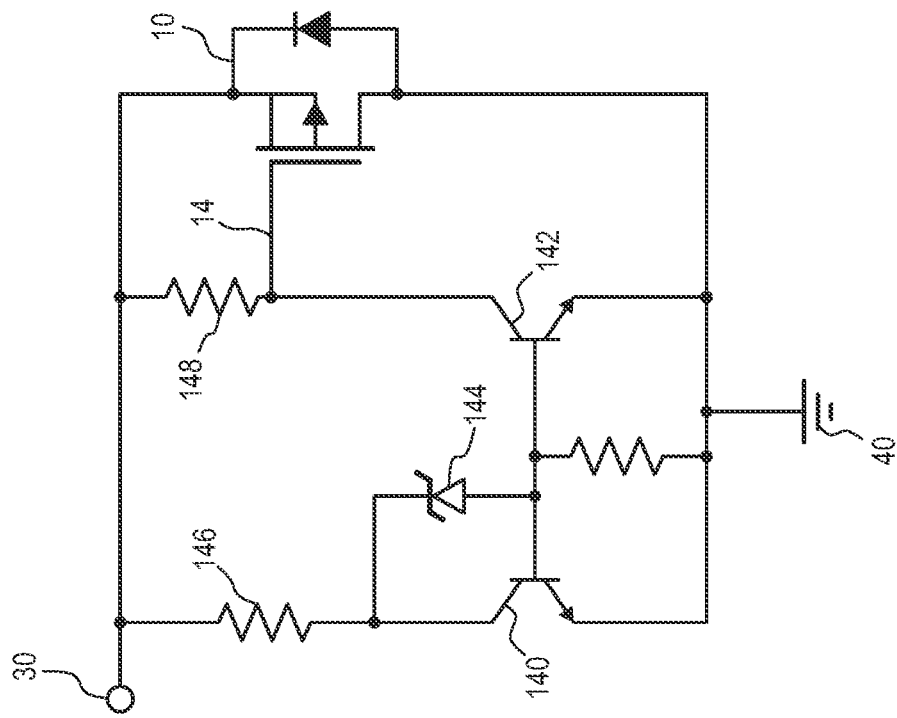
FIGS. 8a and 8b illustrates an EOS FET triggering circuit utilizing a current mirror to amplify the control voltage.
Figure 8A:
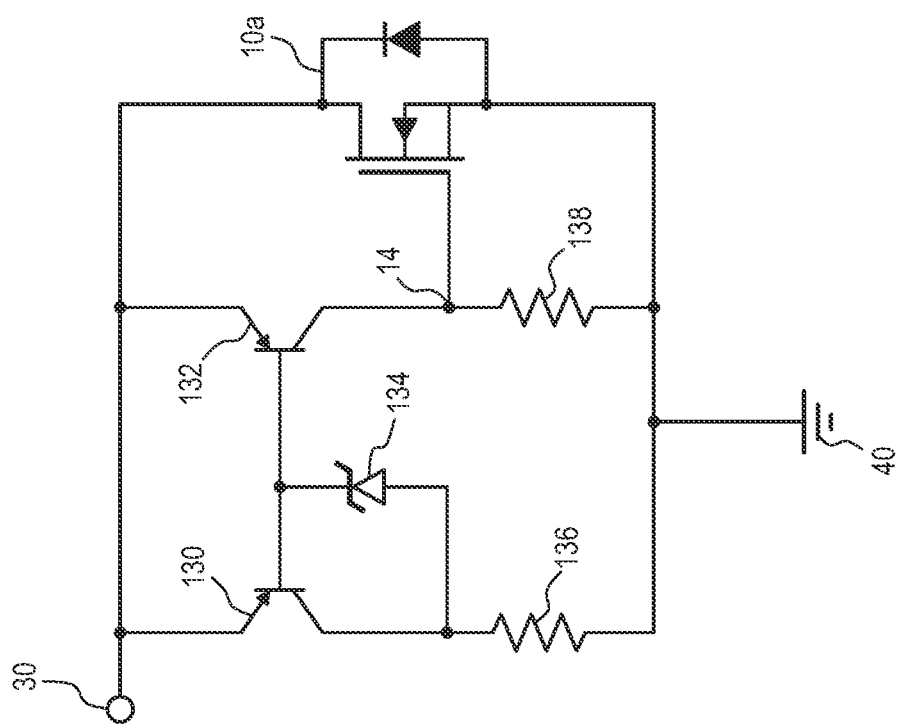

FIGS. 8*a* and 8*b* illustrate embodiments with a current mirror used to amplify the gate voltage applied to an EOS FET. FIG. 8*a* shows n-channel EOS FET 10*a* coupled between $V_{IN}$ node 30 and ground node 40. PNP BJTs 130 and 132 both have emitters coupled to $V_{IN}$ node 30. The base terminals of BJTs 130 and 132 are coupled to each other and a cathode of trigger diode 134. The collector of BJT 130 is coupled to ground node 40 through resistor 136. The collector of BJT 132 is coupled to ground node 40 through resistor 138. Gate 14 of EOS FET 10*a* is coupled between BJT 132 and resistor 138.

A current mirror works by having the emitters and bases of both BJTs 130 and 132 held at approximately the same voltage potential. The voltage potential of $V_{IN}$ node 30 at which the BJTs are turned on is controlled by the $V_{BR}$ of trigger diode 134. Once BJTs 130 and 132 are turned on, the ratio of current through the BJTs is controlled by the ratio of the values of resistors 136 and 138.

When input voltage at $V_{IN}$ node 30 is less than the $V_{BR}$ of trigger diode 134, BJTs 130 and 132 do not conduct significant current, and no significant current flows through resistor 138. The gate of EOS FET 10*a* is at approximately ground potential. When the input voltage increases sufficiently to cause trigger diode 134 to conduct, BJTs 130 and 132 turn on and conduct current. Electrical current through BJT 132 is amplified by configuration of the current mirror ratio, causing the voltage drop across resistor 138 to be a larger magnitude than the voltage drop across resistor 136. The amplification causes the voltage at gate 14 to reach the turn-on threshold of EOS FET 10*a* in circumstances when the circuit might not otherwise be able to turn on the EOS FET. A current mirror could also be implemented with PNP BJTs instead of the illustrated NPN BJTs, or p-channel or n-channel FETs.

FIG. 8*b* illustrates a similar embodiment with p-channel EOS FET 10. Similar to FIG. 8*a*, when $V_{IN}$ node 30 exceeds the $V_{BR}$ of trigger diode 144, current through BJT 140 and resistor 146 is amplified through BJT 142 to a larger voltage drop across resistor 148. The voltage drop across resistor 148 exceeds the turn-on threshold of EOS FET 10, and the surge current is shunted to ground through the EOS FET.

Figure 9B:
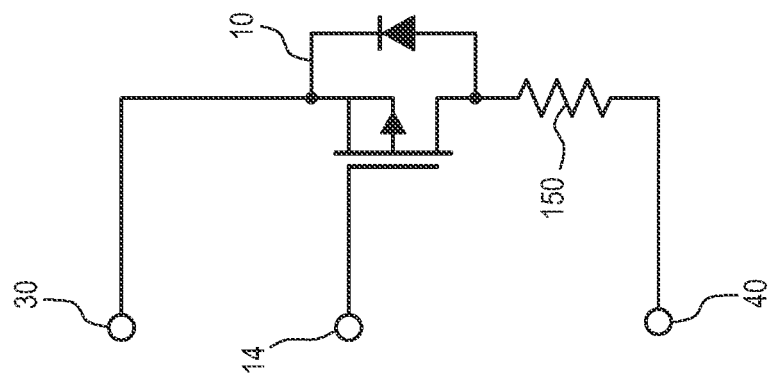
FIGS. 9a and 9b illustrate a resistor in series with the EOS FET.
Figure 9A:
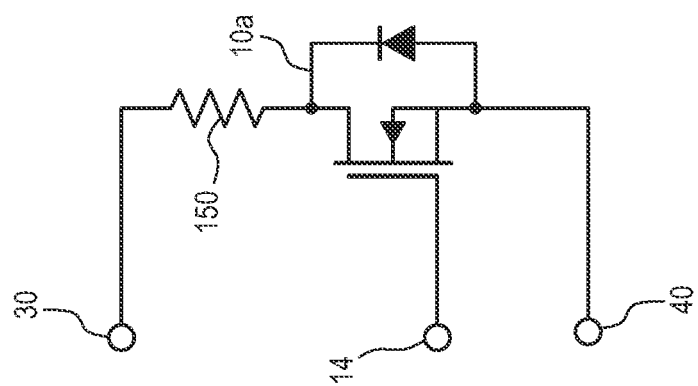

FIGS. 9*a* and 9*b* illustrate an optional resistor 150 coupled in series with the EOS FETs in any of the above embodiments. Resistor 150 shares the voltage stress with the EOS FET, which improves the amount of surge current the EOS FET is capable of handling. Resistor 150 is coupled on the drain side of either the n-channel EOS FET 10*a* or the p-channel EOS FET 10 so that the voltage drop across the resistor does not change the gate-to-source voltage. However, resistor 150 could be placed on the source side of the EOS FET in other embodiments. In the bi-directional embodiments in FIGS. 7*a*-7*c*, resistor 150 can be coupled between the two EOS FETs 110*a* and 110*b* so that the resistor is on the drain side of both EOS FETs.

The protection circuits disclosed above replace the physically large high-voltage and high-current TVS diode, used in the prior art to shunt transients, with a much smaller high-voltage TVS diode that is used to trigger an EOS FET. The EOS FET is the primary current path for unwanted transient current. A bipolar transistor could be used instead of the EOS FET. However, FETs are preferable because voltage is used to control the FET, which has a high impedance for the control circuitry. Getting a sufficient base current for an EOS BJT is more challenging than simply raising a FET's gate to a sufficient voltage potential.

Figure 10:
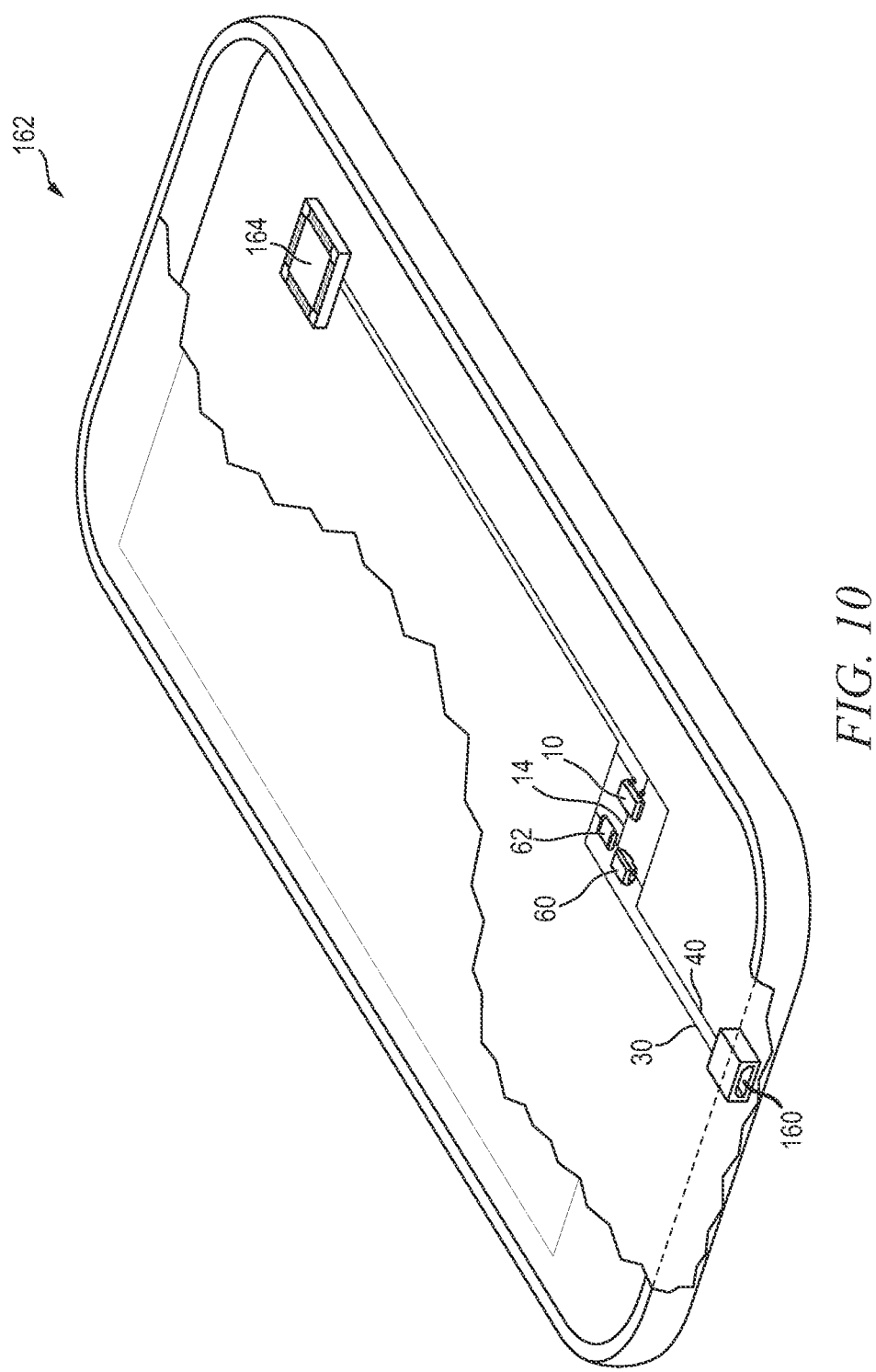
FIG. 10 illustrates the EOS FET coupled to the power input of an electrical device.

FIG. 10 illustrates mobile device 162 with EOS FET 10 coupled between the power and ground conductive traces from a Universal Serial Bus (USB) port 160. The power and ground of USB port 160 are coupled to $V_{IN}$ node 30 and ground node 40, respectively, within mobile device 162. $V_{IN}$ node 30 and ground node 40 are routed to a mobile system-on-chip (SoC) processor 164 to power the SoC. EOS FET 10 is coupled between $V_{IN}$ node 30 and ground node 40 to absorb transient electrical events on the power input. Trigger diode 60 and resistor 62 are provided to turn on EOS FET 10 during transient events. EOS FET 10 provides protection to any connected components of mobile device 162.

Any of the other disclosed triggering mechanism and EOS FET embodiments are used in other embodiments. The disclosed EOS FET circuits can be used to shunt transients to ground in any other suitable electronic device besides mobile device 162. The EOS FET protection circuits can also be used to protect any device coupled to any electrical signal, not just a low voltage power signal, e.g., higher voltage buses, audio signals, data signals, etc.

While one or more embodiments of the present invention have been illustrated in detail, the skilled artisan will appreciate that modifications and adaptations to those embodiments may be made without departing from the scope of the present invention as set forth in the following claims.

What is claimed:

1. A semiconductor device, comprising:
   an input circuit node;
   a ground circuit node;
   a first transistor coupled between the input circuit node and the ground circuit node;
   a first resistor coupled between a control terminal of the first transistor and the ground circuit node;
   a second resistor coupled between the input circuit node and ground circuit node in series with the first transistor, wherein the first transistor includes a conduction terminal coupled to either the input circuit node or ground circuit node through the second resistor, and wherein the conduction terminal is directly coupled to the second resistor;
   a second transistor including a first conduction terminal coupled to the input circuit node and a second conduction terminal coupled to the control terminal of the first transistor;
   a triggering circuit coupled between the input circuit node, the ground circuit node, and a control terminal of the second transistor, wherein the triggering circuit includes,
      a third transistor comprising a control terminal of the third transistor coupled to the Zener diode, and
      a Zener diode and a third resistor coupled in series between the input circuit node and ground circuit node, wherein the control terminal of the second transistor is coupled to a circuit node between the Zener diode and third resistor;

a load including a first terminal of the load coupled directly to the input circuit node and a second terminal of the load coupled directly to the ground circuit node; and a voltage limiting circuit coupled between the first transistor and second transistor, wherein the voltage limiting circuit includes a fourth transistor comprising a first conduction terminal of the fourth transistor coupled to the control terminal of the first transistor and a second conduction terminal of the fourth transistor coupled to the second conduction terminal of the second transistor, wherein the second transistor is coupled to the first transistor through the fourth transistor.

2. The semiconductor device of claim 1, wherein the voltage limiting circuit includes a second Zener diode comprising an anode of the second Zener diode coupled to the ground circuit node and a cathode of the second Zener diode coupled to a control terminal of the fourth transistor.

3. The semiconductor device of claim 2, wherein the voltage limiting circuit includes a fourth resistor comprising a first terminal of the fourth resistor coupled to the control terminal of the fourth transistor and a second terminal of the fourth resistor coupled to the second conduction terminal of the fourth transistor.

4. A semiconductor device, comprising:
a first circuit node;
a second circuit node;
a first transistor including a first conduction terminal coupled to the first circuit node and a second conduction terminal coupled to the second circuit node;
a resistor coupled between the first circuit node and second circuit node in series with the first transistor, wherein either the first conduction terminal of the first transistor is coupled to the first circuit node through the resistor or the second conduction terminal of the first transistor is coupled to the second circuit node through the resistor;
a voltage limiting circuit coupled to a control terminal of the first transistor and the second circuit node;
a second transistor comprising a first conduction terminal of the second transistor coupled to the first circuit node and a second conduction terminal of the second transistor coupled to the control terminal of the first transistor through the voltage limiting circuit; and
a triggering circuit coupled between the first circuit node, the second circuit node, and a control terminal of the second transistor;
wherein the voltage limiting circuit includes a fourth transistor comprising a first conduction terminal of the fourth transistor coupled to the control terminal of the first transistor and a second conduction terminal of the fourth transistor coupled to the second conduction terminal of the second transistor, wherein the second transistor is coupled to the first transistor through the fourth transistor.

5. The semiconductor device of claim 4, further including a load coupled between the first circuit node and the second circuit node to power the load, wherein a first terminal of the load is coupled directly to the first circuit node and a second terminal of the load is coupled directly to the second circuit node.

6. The semiconductor device of claim 4, wherein the triggering circuit includes a Zener diode coupled to the control terminal of the second transistor.

7. The semiconductor device of claim 6, wherein the triggering circuit further includes a third transistor comprising a control terminal of the third transistor coupled to the Zener diode.

8. The semiconductor device of claim 4, wherein the voltage limiting circuit includes a Zener diode comprising an anode of the Zener diode coupled to the second circuit node and a cathode of the Zener diode coupled to a control terminal of the fourth transistor.

9. A method of electrical-overstress protection, comprising:
coupling a first transistor between a first circuit node and second circuit node;
coupling a second transistor between the first circuit node and a control terminal of the first transistor;
coupling a triggering circuit between the first circuit node, the second circuit node, and a control terminal of the second transistor; and
coupling a voltage limiting circuit between the second transistor and the control terminal of the first transistor, wherein the voltage limiting circuit includes a third transistor comprising a first conduction terminal of the third transistor coupled to a first conduction terminal of the second transistor and a second conduction terminal of the third transistor coupled to the control terminal of the first transistor, wherein the second transistor is configured as a driver for the first transistor.

10. The method of claim 9, wherein the triggering circuit includes a Zener diode.

11. The method of claim 10, wherein the triggering circuit further includes a fourth transistor comprising a control terminal of the fourth transistor coupled to the Zener diode.

12. The method of claim 9, wherein the voltage limiting circuit includes a Zener diode coupled to a control terminal of the third transistor.

13. The method of claim 9, further including coupling a resistor between the first circuit node and second circuit node in series with the first transistor.

14. The method of claim 9, further including providing a load including a first terminal of the load coupled directly to the first circuit node and a second terminal of the load coupled directly to the second circuit node.

15. The semiconductor device of claim 8, wherein the voltage limiting circuit includes a third resistor comprising a first terminal of the third resistor coupled to the control terminal of the fourth transistor and a second terminal of the third resistor coupled to the second conduction terminal of the fourth transistor.

* * * * *